(12) United States Patent
Kamijo et al.

(10) Patent No.: US 11,709,388 B2
(45) Date of Patent: Jul. 25, 2023

(54) DISPLAY DEVICE HAVING LIGHT EMITTING DIODE FORMED ON THE ARRAY SUBSTRATE

(71) Applicant: Japan Display Inc., Tokyo (JP)

(72) Inventors: Yoichi Kamijo, Tokyo (JP); Yoshikatsu Imazeki, Tokyo (JP); Shuichi Osawa, Tokyo (JP); Yoshihiro Watanabe, Tokyo (JP); Koichi Miyasaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/824,958

(22) Filed: May 26, 2022

(65) Prior Publication Data

US 2022/0283455 A1 Sep. 8, 2022

Related U.S. Application Data

(63) Continuation of application No. 17/356,732, filed on Jun. 24, 2021, now Pat. No. 11,372,280, which is a continuation of application No. PCT/JP2019/035579, filed on Sep. 10, 2019.

(30) Foreign Application Priority Data

Dec. 27, 2018 (JP) .................. 2018-244662

(51) Int. Cl.
*G02F 1/1334* (2006.01)
*G02F 1/1345* (2006.01)
*G02F 1/1333* (2006.01)

(52) U.S. Cl.
CPC .......... *G02F 1/1334* (2013.01); *G02F 1/1345* (2013.01); *G02F 1/133388* (2021.01)

(58) Field of Classification Search
CPC combination set(s) only.
See application file for complete search history.

(56) References Cited

U.S. PATENT DOCUMENTS 10,466,538 B2* 11/2019 Sugiyama ........... G02F 1/13458
2018/0031758 A1* 2/2018 Mizuno ................... G02F 1/137

* cited by examiner

*Primary Examiner* — Lauren Nguyen
(74) *Attorney, Agent, or Firm* — Michael Best & Friedrich LLP

(57) ABSTRACT

According to one embodiment, a display device includes a first substrate, a second substrate opposing the first substrate, a liquid crystal layer and a light source that emits light to the liquid crystal layer, and the first substrate includes a first portion opposing the second substrate and having a first thickness and a second portion not opposing the second substrate and having a second thickness which is less than the first thickness, and the light source is disposed on the second portion, and the light source includes a first surface opposing the second portion and a second surface opposing the first surface, and a wiring substrate is disposed on the second surface so that the wiring substrate does not protrude with respect to the second substrate in a thickness direction.

12 Claims, 11 Drawing Sheets

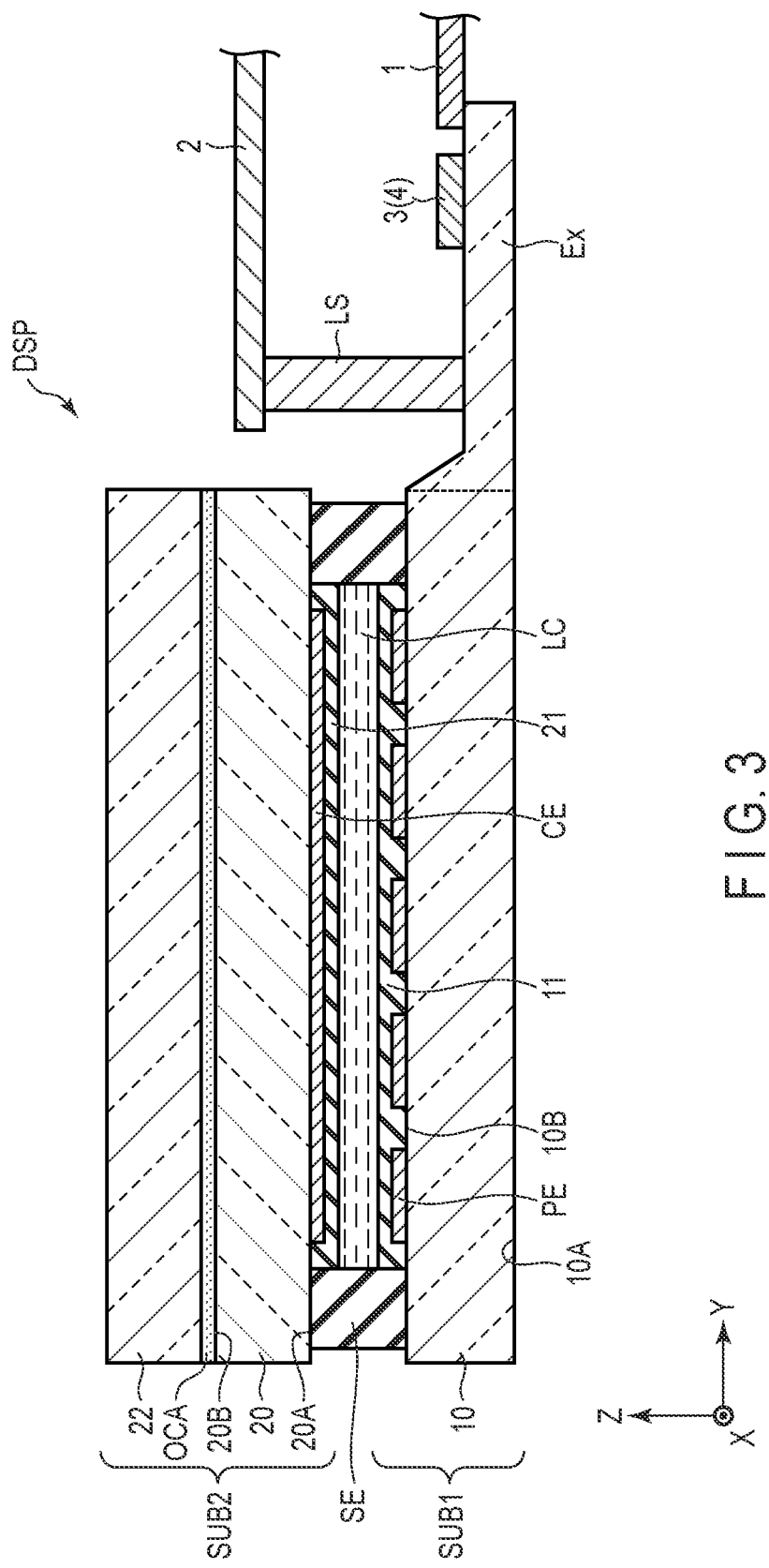
F I G. 3

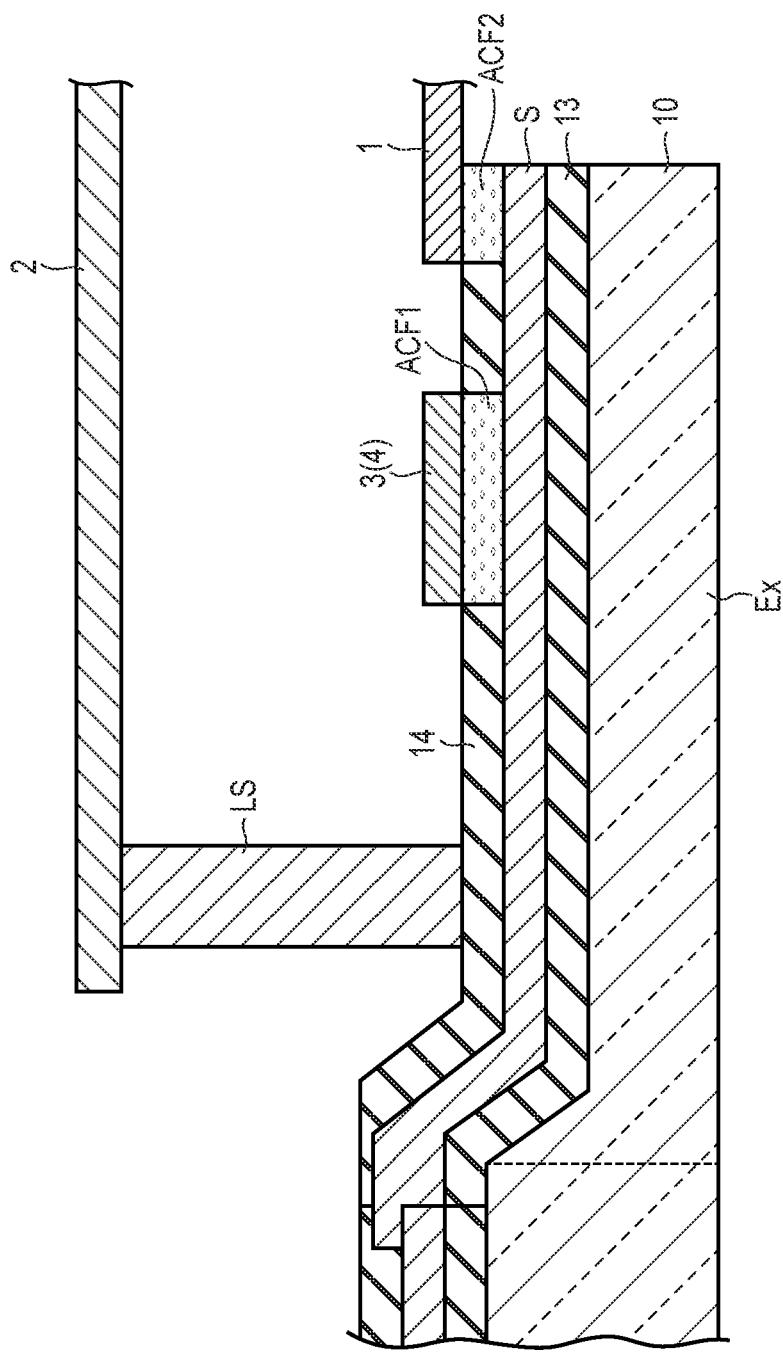
F I G. 4

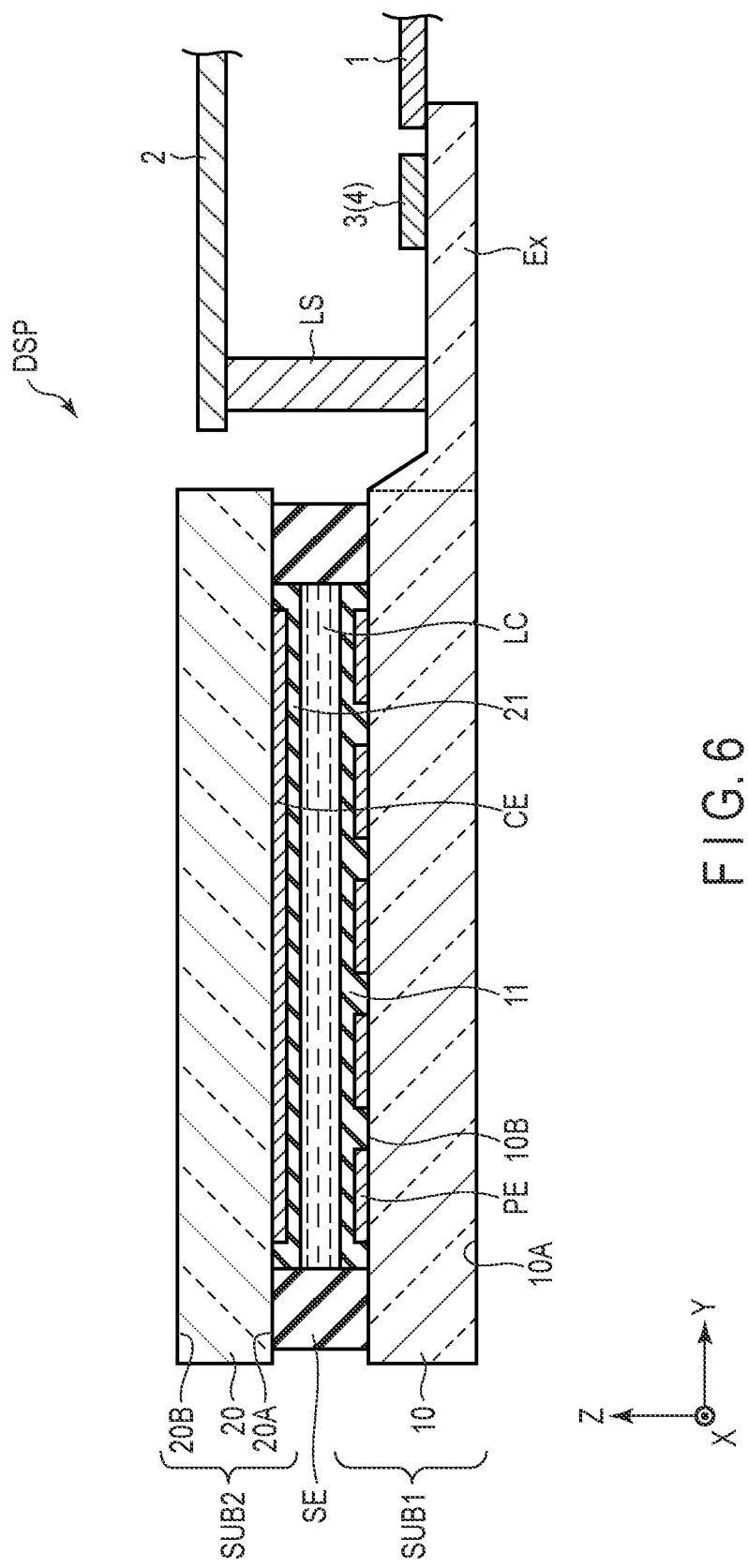
F I G. 6

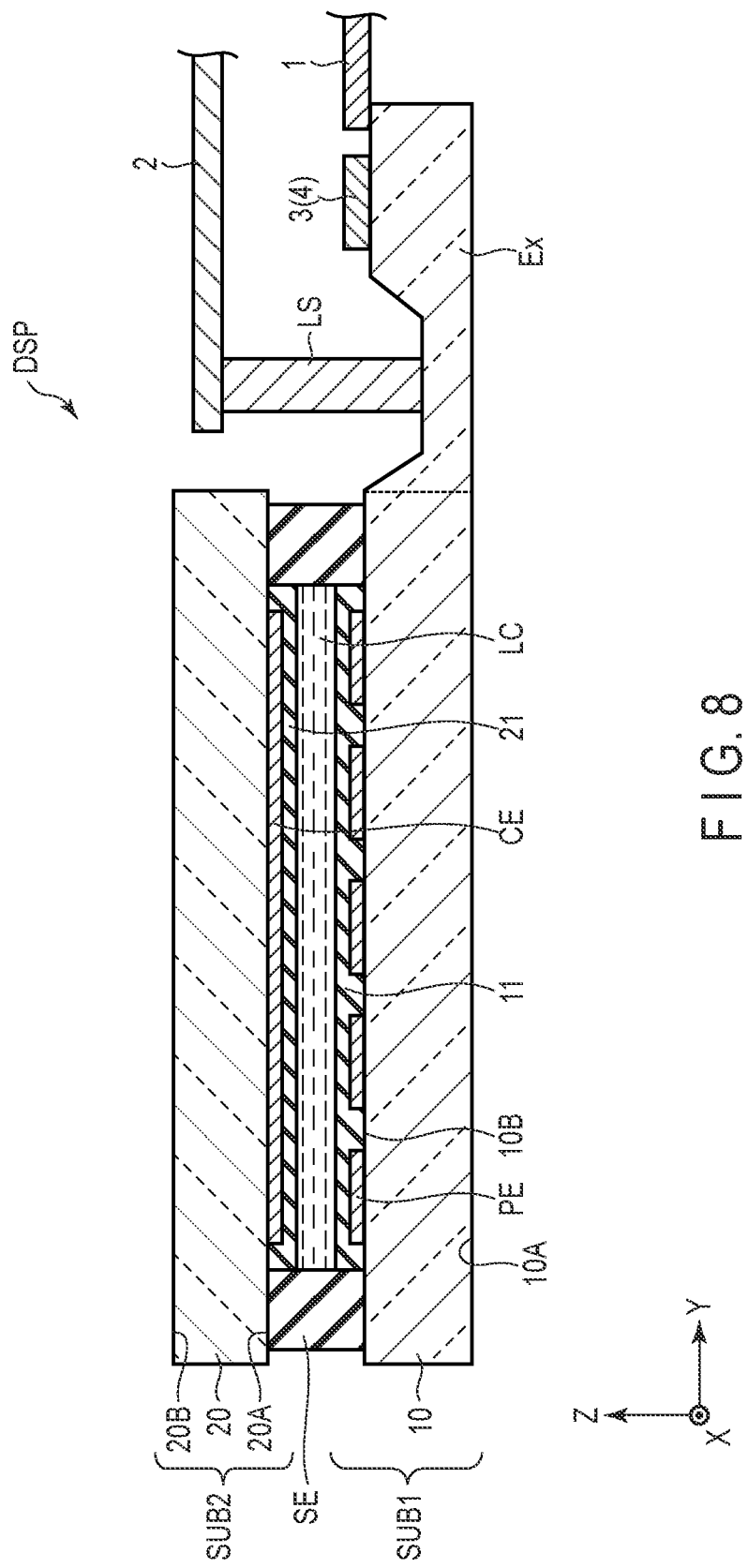
F I G. 8

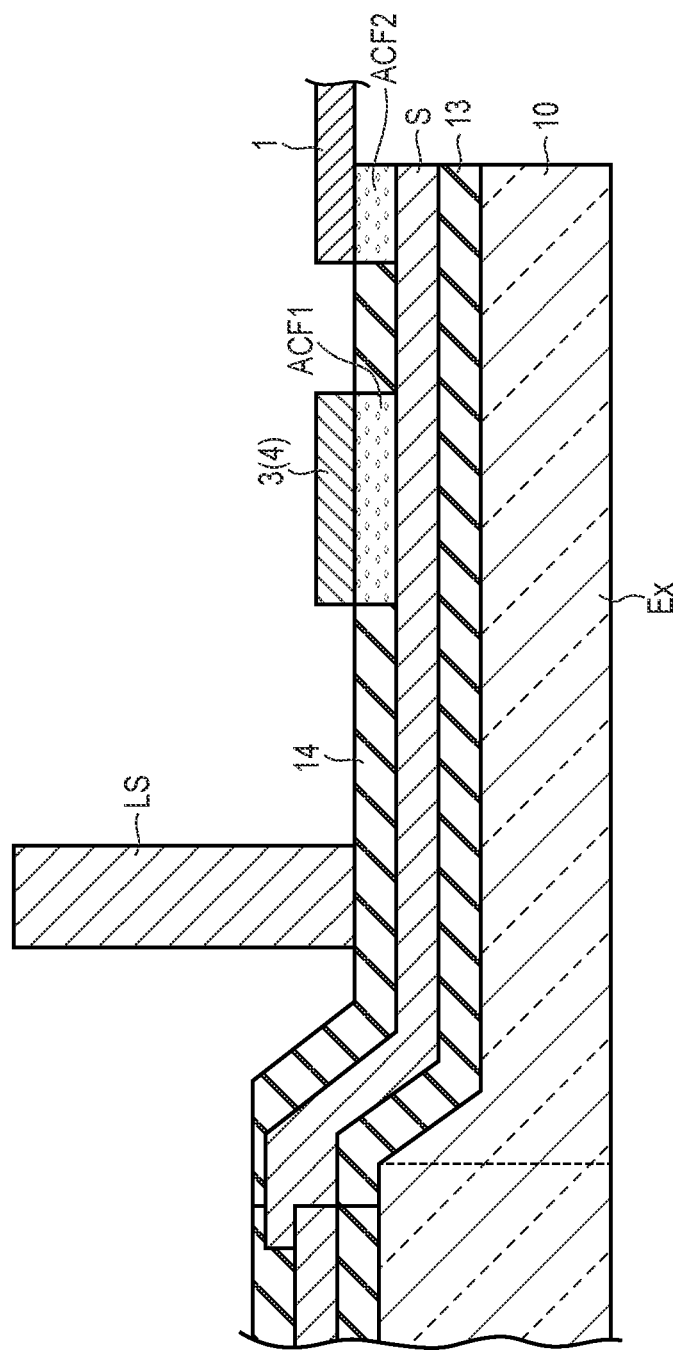
F I G. 11

DISPLAY DEVICE HAVING LIGHT EMITTING DIODE FORMED ON THE ARRAY SUBSTRATE

CROSS-REFERENCE TO RELATED APPLICATIONS

This application is a Continuation Application of U.S. patent application Ser. No. 17/356,732, filed on Jun. 24, 2021, which, in turn, is a Continuation Application of PCT Application No. PCT/JP2019/035579, filed Sep. 10, 2019 and based upon and claiming the benefit of priority from Japanese Patent Application No. 2018-244662, filed Dec. 27, 2018, the entire contents of all of which are incorporated herein by reference.

FIELD

Embodiments described herein relate generally to a display device.

BACKGROUND

In recent years, display devices comprising a light source, a pair of substrates including pixel electrodes and a common electrode and a polymer-dispersed liquid crystal layer disposed between the substrates are known. For example, the polymer-dispersed liquid crystal contains a strip-like polymer and liquid crystal molecules.

In the polymer-dispersed liquid crystal layer, the tilt of the optical axes of the liquid crystal molecules relative to the optical axis of the polymer can be controlled by rotating the liquid crystal molecules using an electric field between the pixel electrode and the common electrode. Thus, the degree of scattering of light from the light source can be controlled for each pixel, thereby making it possible to display any visual images (image) on the display device.

In display devices comprising a polymer-dispersed liquid crystal layer, there is a demand of thinning the devices.

BRIEF DESCRIPTION OF THE DRAWINGS

FIG. 3 is a cross-sectional view schematically showing a configuration example of the display device taken along line A-B in FIG. 1.

FIG. 4 is a cross-sectional view of the display device taken along line C-D in FIG. 2.

FIG. 6 is a cross-sectional view schematically showing another configuration example that can be applied to the display device in FIG. 1.

FIG. 8 is a cross-sectional view schematically showing another configuration example that can be applied to the display device in FIG. 1.

Figure 1:
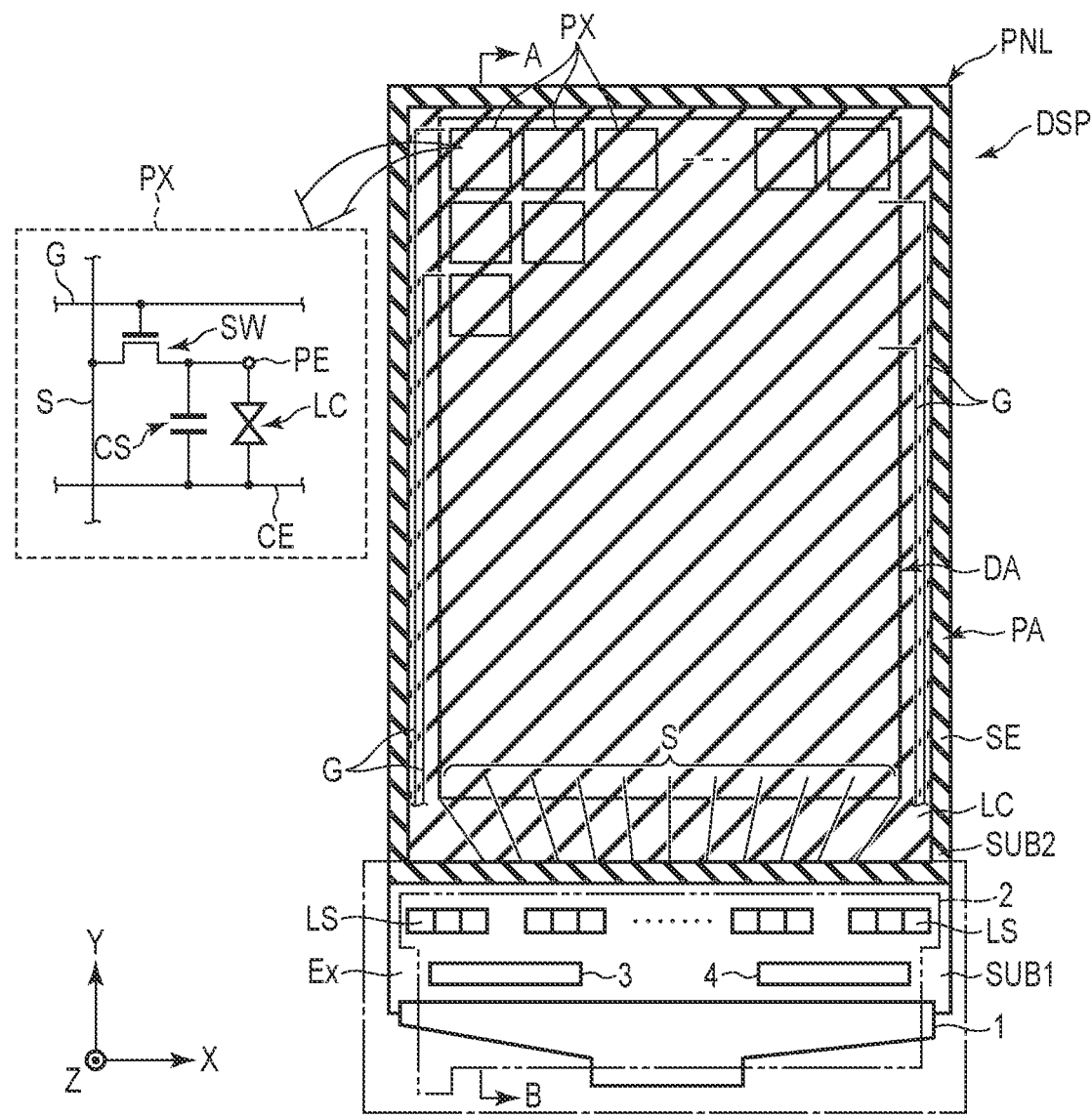
FIG. 1 is a plan view schematically showing a configuration of a display device of an embodiment.

FIG. is a cross-sectional view schematically showing a display device with a configuration different from that of the display device in FIG. 1.

Figure 9:
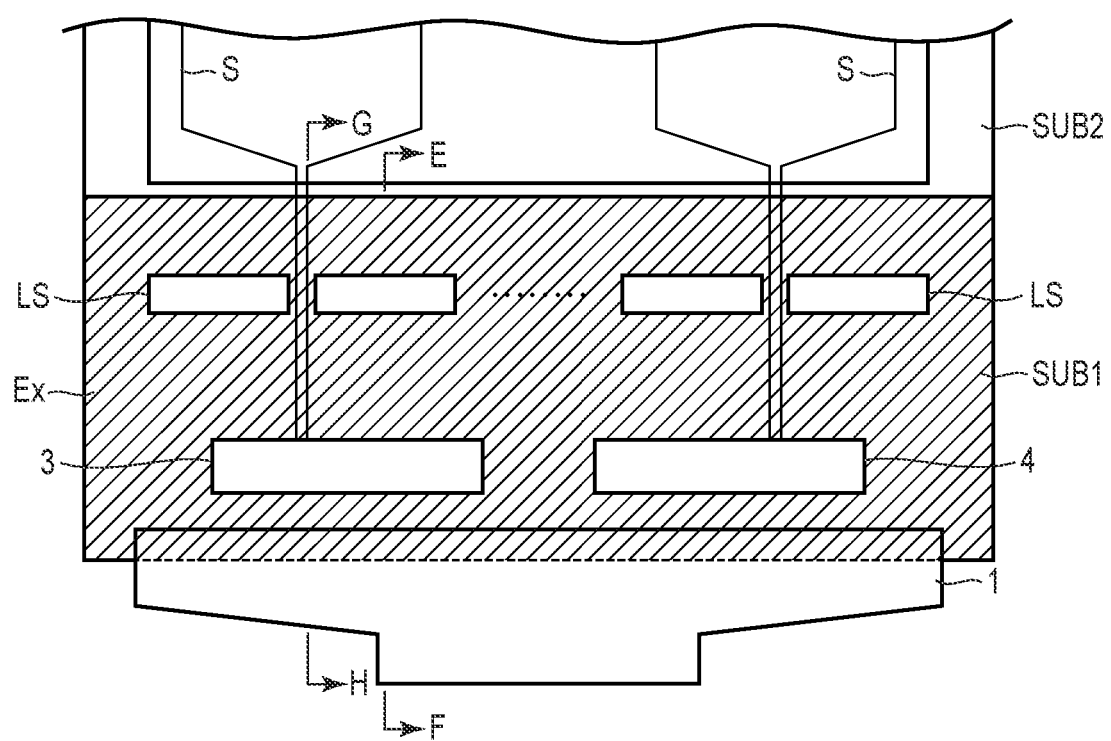
Figure 10:
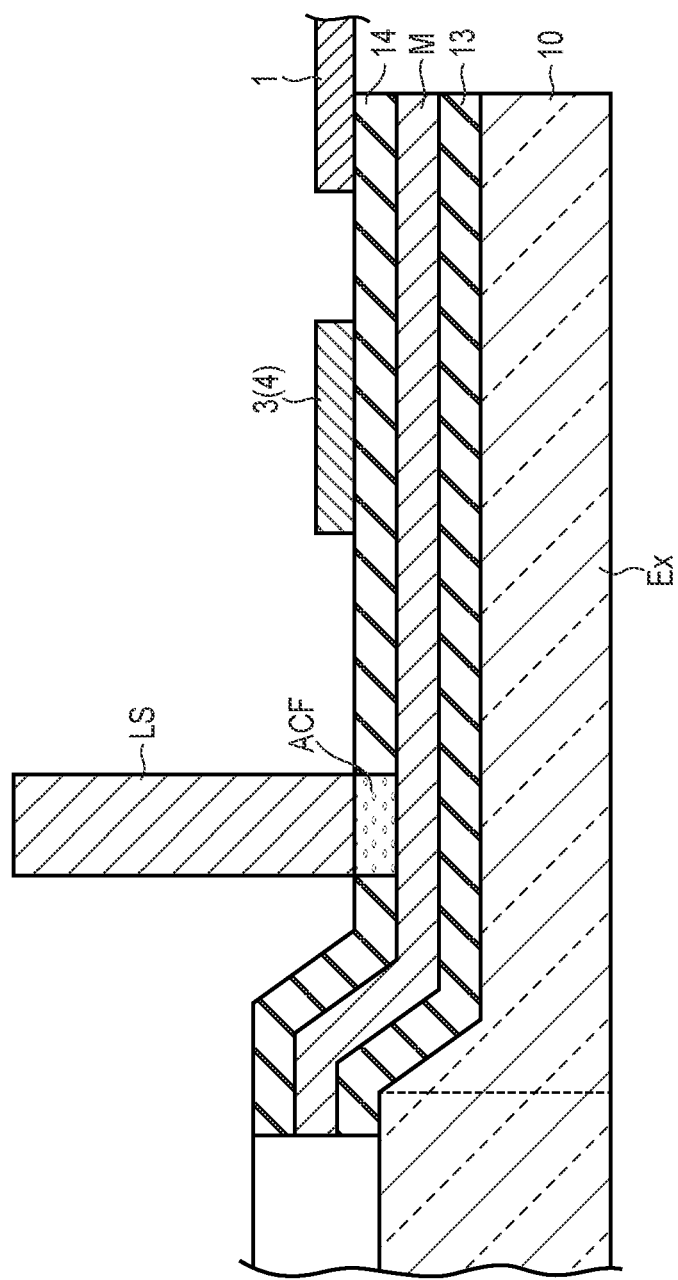

FIG. 10 is a cross-sectional view of the display device taken along line E-F FIG. 9.

FIG. 11 is a cross-sectional view of the display device taken along line G-H in FIG. 9.

DETAILED DESCRIPTION

In general, according to one embodiment, a display device comprises a first substrate, a second substrate opposing the first substrate, a liquid crystal layer disposed between the first substrate and the second substrate and a light source that emits light to the liquid crystal layer. The first substrate comprises a first portion opposing the second substrate and having a first thickness and a second portion not opposing the second substrate and having a second thickness which is less than the first thickness. The light source is disposed on the second portion. The light, source comprises a first surface opposing the second portion and a second surface opposing the first surface. On the second surface, a wiring substrate being disposed so that the wiring substrate does not protrude with respect to the second substrate in a thickness direction.

According to another embodiment, a display device comprises a first substrate, a second substrate opposing the first substrate, a liquid crystal layer disposed between the first substrate and the second substrate and a light source that emits light to the liquid crystal layer. The first substrate comprises a first portion opposing the second substrate and having a first thickness and a second portion not opposing the second substrate and having a second thickness which is less than the first thickness. The light source is disposed on the second portion so as to emit light to a side surface of the second substrate.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the structures are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and redundant explanations may be omitted.

FIG. 1 is a plan view showing a schematic configuration of the display device DSP in this embodiment. In this embodiment, the first direction X, the second direction Y and the third direction Z are orthogonal to each other, but they may intersect at angles other than 90 degrees. The first direction X and the second direction Y correspond to the directions parallel to the main surface of the substrate that constitutes the display device DSP. The third direction Z corresponds to the thickness direction of the display device DSP. In this embodiment, viewing the X-Y plane defined by the first direction X and the second direction Y is called planar view.

In this embodiment, a liquid crystal display device to which a polymer-dispersed liquid crystal (PDLC) is applied, is disclosed as an example of the display device DSP. The display device DSP comprises a display panel PNL, wiring substrates 1 and 2, IC chips (drive circuits) 3 and 4, a plurality of light sources LS, and the like.

The display panel PNL comprises a first substrate (array substrate) SUB1, a second substrate (counter-substrate) SUB2, a liquid crystal layer LC, and a sealant SE. The first substrate SUB1 and the second substrate SUB2 are each formed into a flat plate shape parallel to the X-Y plane and oppose each other in the third direction Z. The sealant SE is formed into a loop shape, for example, and adheres the first substrate SUB1 and the second substrate SUB2 to each other. The liquid crystal layer LC is disposed between the first substrate SUB1 and the second substrate SUB2, and is sealed by the sealant SE.

The display panel PNL comprises a display area DA which displays images and a frame-shaped peripheral area PA which surrounds the display area DA. The distance between a long side of the display area DA and a long side of the peripheral area PA, which is adjacent to the long side of the display area DA is, for example, 3 mm. The sealant SE is placed on the peripheral area PA. The display area DA contains a plurality of pixels PX arranged in a matrix along the first direction X and the second direction Y.

As enlargedly shown in FIG. 1, each pixel PX comprises a switching element SW, a pixel electrode PE and a common electrode CE. The switching element SW is constituted from a thin-film transistor (TFT), for example, and is electrically connected to a scanning line G and a signal line S. The scanning line G is electrically connected to the switching element SW in each of the pixels PX arranged along the first direction X. The signal line S is electrically connected to the switching element SW in each of the pixels PX arranged along in the second direction Y. The pixel electrode PE is electrically connected to the switching element SW. The common electrode CE is provided in common over a plurality of pixel electrodes PE. The liquid crystal layer LC is driven by an electric field generated between the pixel electrodes PE and the common electrode CE. The capacitance CS is formed, for example, between an electrode at the same potential as that of the common electrode CE and an electrode at the same potential as that of the respective pixel electrode PE.

The scanning lines C, the signal lines S, the switching elements SW and the pixel electrodes PE are provided on the first substrate SUB1, and the common electrode CE is provided on the second substrate SUB2. The scanning lines C extends out to the peripheral area PA and are electrically connected to the IC chips 3 and 4, respectively. The signal lines S extend out to the peripheral area PA and are electrically connected to the IC chips 3 and 4, respectively.

The wiring substrate 1 is electrically connected to terminals located in the extending portion Ex of the first substrate SUB1. The extending portion Ex is equivalent to the portion of the first substrate SUB1, which does not oppose the second substrate SUB2. For example, the wiring substrate 1 is a flexible printed circuit board. The wiring substrate 2 is electrically connected to the light sources LS located in the extending portion Ex. For example, the wiring substrate 2 is a flexible printed circuit board.

The IC chips 3 and 4 incorporate, for example, a scanning line drive circuit and a signal line drive circuit, which output signals necessary for image display. Although two IC chips 3 and 4 are illustrated here, there may be one IC chip or three or more. The IC chips 3 and 4 may as well be mounted on the wiring substrate 1.

The light sources LS are disposed in the extending portion Ex. The light sources LS are arranged to be spaced apart at intervals along the first direction X. Each light source LS comprises, for example, a light-emitting element that emits red light, a light-emitting element that emits green light and a light-emitting element that emits blue light. The light-emitting elements can be, for example, light-emitting diodes (LEDs), but are not limited to this example.

Figure 2:
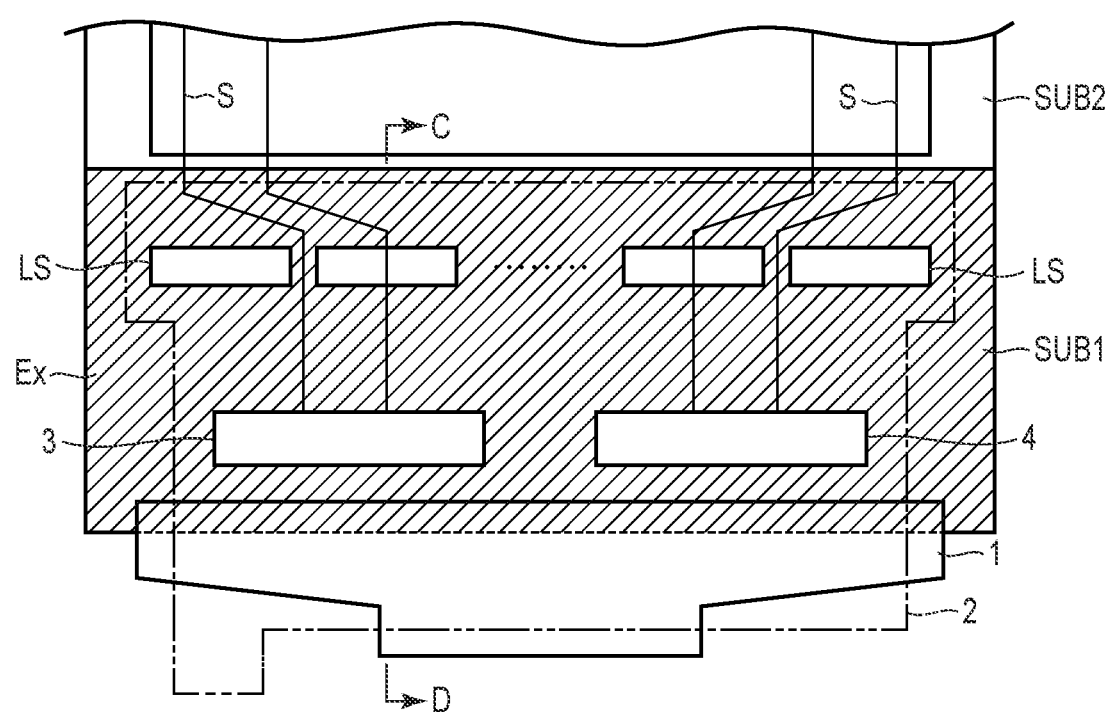
FIG. 2 is an enlarged view of an area enclosed by a single-dotted line in FIG. 1.

FIG. 2 is an enlarged plan view showing the region enclosed by the single-dotted line shown in FIG. 1 (mainly, the extending portion Ex). The shaded region shown in FIG. 2 is equivalent to the extending portion Ex. The extending portion Ex may be referred to as a portion of the first substrate SUB1 on a peripheral area PA side. In this case, the portion of the first substrate SUB1, which opposes the second substrate SUB2 may be referred to as a portion of the first substrate SUB1, on a display area DA side. As will be explained in detail later, the extending portion Ex is ground into a band shape by mechanical polishing or chemical etching with hydrofluoric acid, and is made thinner than the display area DA-side portion of the first substrate SUB1. In other words, the extending portion Ex is thinner than the thickness of the display area DA-side portion of the first substrate SUB1. The thickness of the display area DA-side portion of the first substrate SUB1, (which will be, hereinafter, referred to as the first thickness) is, for example, 0.7 mm, and the thickness of the extending portion Ex, which is thinned, (which will be, hereinafter referred to as the second thickness) is, for example, 0.35 mm. Note that the values of the first and second thicknesses are not limited to those of this example.

FIG. 3 is a schematic cross-sectional view showing a configuration example applicable to the display device DSP shown in FIG. 1. FIG. 3 is a cross-sectional view of the display device DSP taken along line A-B shown in FIG. 1. Here, in the cross section of the display device DSP in the Y-Z plane defined by the second direction Y and the Third direction Z, only the main parts will be described.

The first substrate SUB1, which constitutes the display panel PNL, comprises a first transparent substrate 10, pixel electrodes PE, a first alignment film 11 and the like. The first transparent substrate 10 comprises a first surface 10A and a second surface 10B on an opposite side to the first surface 10A. The pixel electrodes PE are disposed on the second side 10B of the first transparent substrate 10. The first alignment film 11 covers the pixel electrodes PE.

The second substrate SUB2, which constitutes the display panel PNL, comprises a second transparent substrate 20, a second alignment film 21, a common electrode CE, an adhesive layer OCA, a cover member 22, and the like. The second transparent substrate 20 comprises a first surface 20A opposing the first transparent substrate 10 and a second surface 20B on an opposite side to the first surface 20A. The common electrode CE is disposed on the first surface 20A side of the second transparent substrate 20. The common electrode CE opposes a plurality of pixel electrodes PE in the third direction Z. The second alignment film 21 covers the common electrode CE. The cover member 22 is adhered to the second surface 20B side of the second transparent substrate 20 via the adhesive layer OCA. The second transparent substrate 20 has a thickness of, for example, 0.7 mm in the third direction Z. The adhesive layer OCA has a thickness of, for example, 0.1 mm in the third direction Z. The cover member 22 has a thickness of, for example, 0.7 mm in the third direction Z. That is, the second substrate SUB2 has a thickness of, for example, 1.5 mm in the third direction Z. The thickness of each layer is not limited to the values set out above.

The liquid crystal layer LC which constitutes the display panel PNL is disposed between the first alignment film 11 and the second alignment film 21, and is sealed by the sealant SE which constitutes the display panel PNL.

The first transparent substrate 10 and the second transparent substrate 20 are insulating substrates, such as glass or plastic substrates, for example. The pixel electrodes PC and the common electrode CE are each formed of a transparent conductive material such as indium tin oxide (ITO) or indium zinc oxide (IZO), for example. The first alignment film 11 and the second alignment film 21 are horizontal alignment films having an alignment restriction force that is substantially parallel to the X-Y plane. The alignment restrict on force may be imparted by rubbing treatment or by photo-alignment treatment. The cover member 22 is formed of, for example, glass. The adhesive layer OCA is, for example, a film-like optical adhesive sheet, and it is preferable to have a refractive index close to that of the second transparent substrate 20 and the cover member 22.

Although omitted from the illustration of FIG. 3, a first optical function layer may be further provided on the lower surface (a first surface 10A side) of the first transparent substrate 10. Further, a second optical function layer may be further provided on the upper surface of the cover member 22, (which is a surface of the second transparent substrate 20, which does not oppose the second surface 20B). As the first optical function layer and the second optical function layer, for example, an ultraviolet light-absorption layer or an anti-reflective layer may be applied. When an ultraviolet light-absorption layer is applied, degradation of the liquid crystal layer IC by ultraviolet light can be suppressed. When an anti-reflective layer is applied, reflection of external light can be suppressed, thereby making it possible to improve the visibility of images or backgrounds. Both the first optical function layer and the second optical function layer may contain both an ultraviolet light-absorption layer and an anti-reflective layer. In addition to the effects described above, the ultraviolet light-absorption layer and the anti-reflective layer can as well exhibit the secondary effect of improving the strength of the display device DSP.

The light sources LS are adhered (fixed) to the extending portion Ex of the first substrate SUB1 by an adhesive member such as double-sided tape, for example, and opposes a side surface of the second substrate SUB2. In more detail, the light sources LS at least oppose the side surface of the second transparent substrate 20 which constitutes the second substrate SUB2, and may or may not oppose the side surface of the cover member 22 (and the adhesive layer OCA). The light emitted from the light sources LS enters from the side surface of the second transparent substrate 20 and propagates inside the second transparent substrate 20. If the light sources LS oppose also the side surface of the cover member 22, the light emitted from the light sources LS may propagate inside the cover member 22 in addition to the second transparent substrate 20. The light sources LS are electrically connected to the wiring substrate 2 and emits light by the power obtained from the wiring substrate 2.

A slight air layer is provided between the light sources LS and the second substrate SUB2 (the side surface of the second substrate SUB2). More specifically, the light sources LS and the second substrate SUB2 are arranged to be apart from each other by a distance of 0.3 mm, for example. This air layer can prevents the unevenness in luminance of the light sources LS from propagating to the second substrate SUB2. The interval between the light sources LS and the second substrate SUB2 is not limited to the value described above.

Between the extending portion Ex where the light sources LS are disposed, and the display area DA-side portion of the first substrate SUB1, a step is provided, which corresponds to the difference between the first thickness of the display area DA-side portion of the first substrate SUB1 and the second thickness of the extending portion Ex. The step is created such that the position of the wiring substrate 2 disposed on the upper surface of the light source LS (the surface not opposing the first substrate SUB1) in the third direction Z is lower than the position of the second substrate SUB2 (the cover member 22) in the third direction Z, (which is, in other words, the step is created such that the wiring substrate 2 does not protrude with respect to the second substrate SUB2 in the thickness direction). In other words, the first thickness and the second thickness have the relationship that the sum of the second thickness, the thickness of the light sources LS and the thickness of the wiring substrate 2 is less than the sum of the first thickness and the thickness of the second substrate SUB 2. Note that the thickness of the sealant SE (in other words, the thickness of the pixel electrode PE, the first alignment film 11, the liquid crystal layer LC, the second alignment film 21 and the common electrode CE) is negligibly small and is omitted here. Thus, it is possible to realize a thinner display device DSP even if the light sources LS are not thinned.

The IC chip 3 and the wiring substrate 1 are disposed in the extending portion EH of the first substrate SUB1 and are electrically connected to the first substrate SUB1.

FIG. 4 is a cross-sectional view of the display device DSP taken along line C-D shown in FIG. 2. Although not shown in FIG. 3, the first substrate SUB1 further comprises a first insulating film 13, a signal line S, a second insulating film 14, a first anisotropic conductive film ACF1, a second anisotropic conductive film ACF2 and the like. The signal line S is disposed between the first insulating film 13 and the second insulating film 14. The signal line S is electrically connected to the IC chip 3 via the first anisotropic conductive film ACF1. The signal line S is electrically connected to the circuit board 1 via the second anisotropic conductive film ACF2. The first anisotropic conductive film ACF1 and the second anisotropic conductive film ACF2 are formed in the same layer as that of the second insulating film 14. The signal line S and the light sources LS are insulated by the second insulating film 14 disposed therebetween. The signal line S overlaps another signal line S extending to the display area DA side in a further side of the step provided between the extending portion Ex and the display area DA-side portion, and is electrically connected thereto. Although detailed illustrations are omitted in FIG. 4, the first insulating film 13 and the second insulating film 14 similarly overlap another first insulating film 13 and another second insulating film 14, respectively, formed on the display area DA side in a further side of the step provided between the extending portion Ex and the display area DA-side portion.

The process of grinding the extending portion Ex by mechanical polishing or chemical etching in order to provide the step shown in FIGS. 2 to 4 may be performed before or after individual pieces are cut out from the mother glass.

Figure 5:
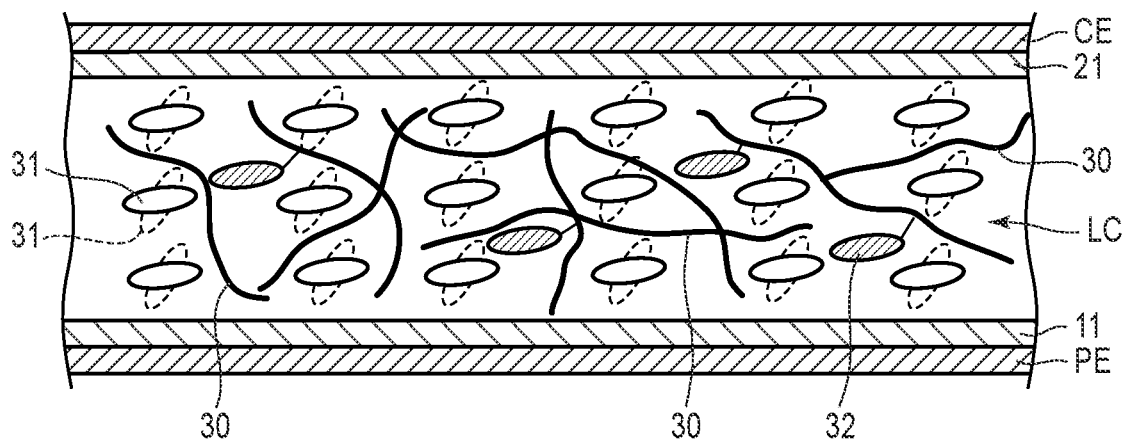
FIG. 5 as a diagram illustrating a configuration example of a liquid crystal layer.

FIG. 5 is a schematic cross-sectional view of the display panel PNL to illustrate a configuration example of the liquid crystal layer LC. In this embodiment, the liquid crystal layer IC contains a strip-like (network-like) polymer 30 and liquid crystal molecules 31. For example, the polymer 30 is a liquid crystalline polymer. The liquid crystal molecules 31 are dispersed in gaps of the polymer 30. As shown in FIG. 5, there may be monomers 32 connected to the polymer 30.

Such a liquid crystal layer LC is obtained, for example, by injecting liquid crystal monomer between the first and second alignment films 11 and 21, and irradiating ultraviolet light onto the liquid crystal monomer aligned in a predetermined direction by the alignment restriction force of the alignment films 11 and 21. That is, the liquid crystal monomer is polymerized by UV light, thus forming a strip-like polymer 30.

Each of the polymer 30 and the liquid crystal molecules 31 has optical anisotropy or refractive index anisotropy. The responsiveness of the polymer 30 to electric fields is lower than that of the liquid crystal molecules 31 to electric fields. For example, the alignment direction of the polymer 30 does not substantially change regardless of the electric field between the pixel electrodes PE and the common electrode CE, On the other hand, the alignment direction of the liquid crystal molecules 31 changes according to the electric field.

In FIG. 5, the liquid crystal molecules 31 illustrated by solid lines illustrate an alignment state when there is no potential difference between the pixel electrodes PE and the common electrode CE (when no electric field is formed). On the other hand, the liquid crystal molecules illustrated by dashed lines illustrate an alignment state when there is a potential difference between the pixel electrodes PE and the common electrode CE (when an electric field is formed).

In the state where there is no electric field acting on the liquid crystal layer LC or when the electric field is extremely low, the optical axes of the polymer 30 and the liquid crystal molecules 31 are substantially parallel to each other. Therefore, the light entering the liquid crystal layer LC is transmitted through the liquid crystal layer LC without substantially scattering. Such a state may be referred to as a transparent state. The voltage of the pixel electrode PE to realize the transparent state may also be referred to as the transparent voltage. The transparent voltage may be the same as the common voltage applied to the common electrode CE, or it may be a voltage slightly different from the common voltage.

On the other hand, when a sufficient electric field is acting on the liquid crystal layer LC. The respective optical axes of the polymer 31 and liquid crystal molecules 32 cross each other. Therefore, the light entering the liquid crystal layer LC is scattered within the liquid crystal layer IC. Such a state may be referred to as a scattering state. The voltage of the pixel electrode PE to realize the scattering state may also be referred to as the scattering voltage. The scattering voltage is a voltage such that the potential difference with respect to the common electrode CE becomes larger than the transparent voltage.

In this embodiment, as shown in FIG. 3, a case where the cover member 22 is disposed on the upper surface (a second surface 20B side) of the second transparent substrate 20 via the adhesive layer OCA is illustrated, but the configuration of the display device DSP is not limited thereto. For example, as shown in FIG. 6, the adhesive layer OCA and the cover member 22 may not be disposed on the upper surface of the second transparent substrate 20. In this case, the step created between the extending portion Ex and the display area DA-side portion is provided such that the position of the wiring substrate 2 disposed on the upper surfaces of the light sources LS in the third direction Z is lower than the position of the second substrate SUB2 (the second transparent substrate 20) in the third direction Z. With this structure, even if the light sources LS are not thinned, the display device DSP can be made thinner and the cost can be reduced by omitting the adhesive layer OCA and the cover member 22.

Figure 7:
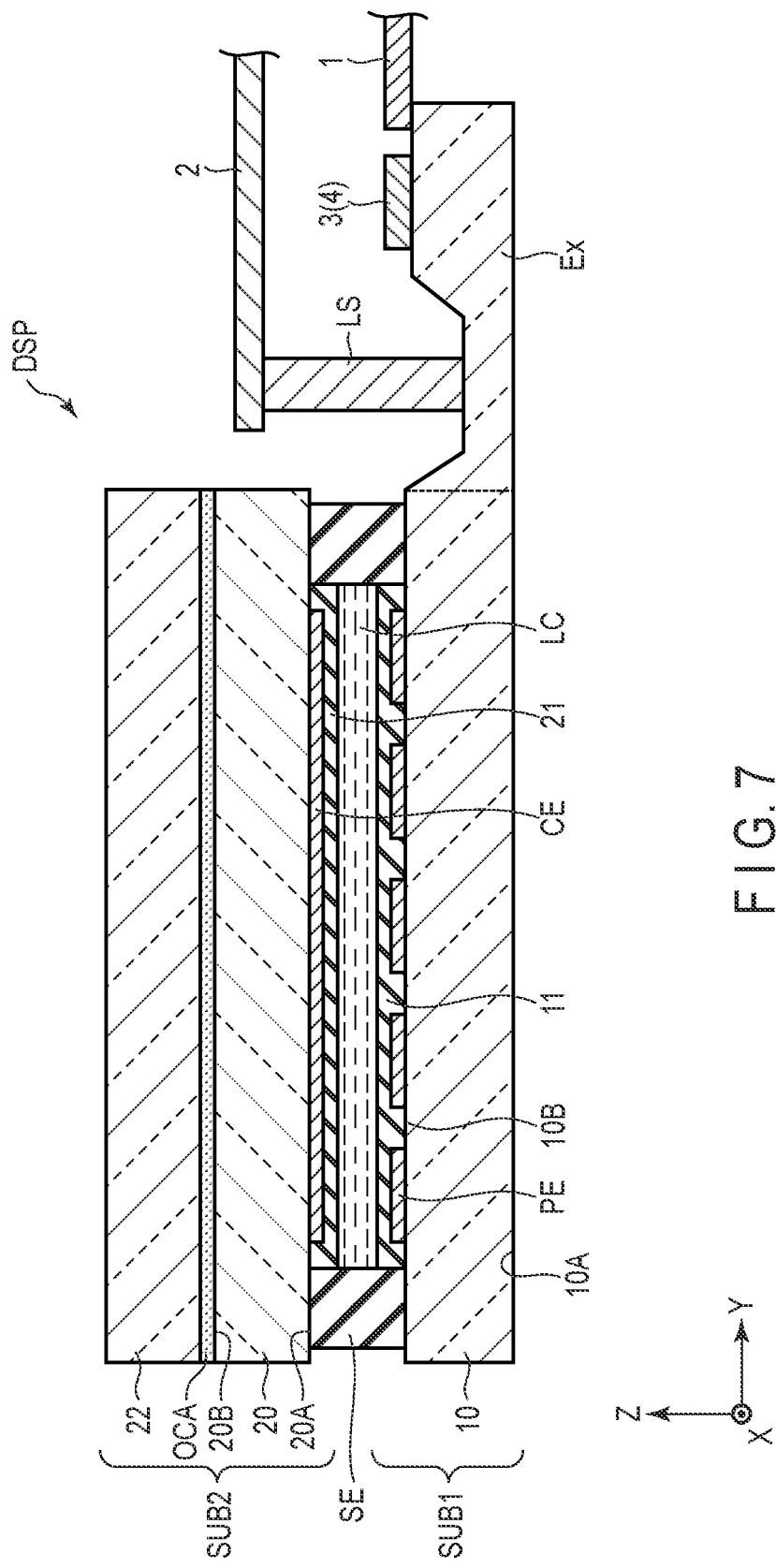
FIG. 7 is a cross-sectional view schematically showing still another configuration example that can be applied to the display device in FIG. 1.

Further, in this embodiment, as shown in FIG. 3, a step is provided between the extending portion Ex and the display area DA-side portion by thinning the extending portion Ex, but the configuration of the display device DSP is not limited thereto. For example, as shown in FIG. 7, it may be configured that a concave portion (zagging section) is formed in a part of the extending portion Ex and a light source LS is placed in the concave portion so that the wiring substrate 2 placed on the upper surface of the light source LS does not protrude with respect to the second substrate SUB2. The length (width) of the concave portion in the second direction Y is, for example, 10 mm, but it can be any value as long as it is greater than the width of the light source LS. FIG. 7 shows that only the light source LS is disposed in the concave portion, but the IC chip 3 may be further placed in the concave portion.

Even in the configuration where a concave portion is formed in a part of the extending portion Ex, the adhesive layer OCA and the cover member 22 to be disposed on the upper surface of the second transparent substrate 20 may be omitted, as shown in FIG. 8.

In this embodiment, a case is illustrated, where the light source LS is electrically connected to the wiring substrate 2 and light is emitted by obtaining electric power from the wiring substrate 2. But the light source LS may be electrically connected to the metal wiring line provided on the first substrate SUB1 to obtain power from the metal wiring for emitting light.

FIG. 9 is a plan view schematically showing the extending portion Ex in the case where metal wiring line electrically connected to the light source LS is provided on the first substrate SUB1. The metal wiring line electrically connected to the light source LS is formed on the same layer as that of the signal line S. Therefore, as shown in FIG. 9, when the metal wiring line electrically connected to the light source LS is provided on the first substrate SUB1, the signal line S is electrically connected with the IC chips 3 and 4 in such a way that, for example, it is passed between the two light sources LS to not overlap the light sources LS. In another expression, the signal line S is extended to bypass the respective light source LS and is electrically connected to the IC chips 3 and 4.

FIG. 10 is a cross-sectional view of the display device DSP taken along line E-F shown FIG. 9. In this cross section, the first substrate SUB1 includes the first insulating film 13, the metal wiring line M, the second insulating film 14, the anisotropic conductive film ACF and the like. As shown in FIG. 9, the signal line S is not illustrated in this cross section because it is extended to bypass the respective light source LS. The metal wiring line N is placed between the first insulating film 13 and the second insulating film 14, that is, in the same layer as that of the signal line S. The metal wiring line M is electrically connected to the light source LS via the anisotropic conductive film ACF. The anisotropic conductive film ACF is formed in the same layer as that of the second insulating film 14. The metal wiring line M is insulated from the IC chip 3 and the wiring substrate 1 by the second insulating films 14 placed therebetween. The metal wiring line M is interrupted in the further side of the step provided between the extending portion Ex and the display area DA-side portion.

Unlike FIG. 10, FIG. 11 as a cross-sectional view of the display device DST taken along line G-H shown in FIG. 9. In this cross section, the first substrate. SUB1 contains the first insulating film 13, the signal line S, the second insulating film 14, the first anisotropic conductive film ACF1, the second anisotropic conductive film ACF2 and the like. The signal line S is extended to bypass the light source LS so as to avoid overlapping the metal wiring line M. Therefore, the metal wiring line M is not present in this cross section. The signal line S is insulated from the light source LS by the second insulating film 14. The signal line S is electrically connected to the IC, chip 3 by the first anisotropic conductive film. ACF1, and electrically connected to the wiring substrate 1 by the second anisotropic conductive film ACF2. The configuration shown in FIG. 11 is similar to that shown in FIG. 4 except that the wiring substrate 2 is omitted, and therefore a further detailed explanation is omitted here.

As shown in FIGS. 9 to 11, when the light source LS is electrically connected to the metal wiring line M and to obtain power from the metal wiring line M for emitting light, the wiring substrate 2 to be disposed on the upper surface of the light source LS can be omitted. Thereby, the cost can be reduced by omitting the wiring substrate 2.

When the wiring substrate 2 is omitted, the step between the extending portion Ex and the display area DA-side portion is formed so that the light source LS does not protrude with respect to the second substrate SUBS. Further, in the case where the wiring substrate 2 is omitted in place of providing the metal wiring line M, any of the configurations shown in FIG. FIG. 6 to FIG. 8 can be applied to the display device DSP. In other words, the display device DSP may be configured in which the wiring substrate 2 shown in FIGS. 3, 6 to 8 is omitted.

According to one embodiment described above, a display device comprising a polymer-dispersed liquid crystal layer can be thinned.

Based on the display device described above as an embodiment of the present invention, all display devices That may be designed and modified by those skilled in the art as appropriate and implemented also belong to the scope of the present invention as lone as they include the gist of the present invention.

Within the scope of the idea of the present invention, those skilled in the art may come up with various variations, and these variations are also understood to belong to the scope of the present invention. For example, if a person skilled in the art adds, deletes, or changes the design of components, or adds, omits, or changes the conditions of a process, to each of the above-mentioned embodiments, they are also included in the scope of the invention as long as they have the gist of the invention.

In addition, other effects brought about by the modes described in each embodiment, which are obvious from the description herein or which can be conceived by those skilled in the art, are naturally understood to be brought about by the present invention.

The followings are examples of the display device obtained from the embodiments.

[1]
A display device comprising:
a first substrate;
a second substrate opposing the first substrate;
a liquid crystal layer disposed between the first substrate and the second substrate; and
a light source that emits light to the liquid crystal layer, wherein
the first substrate comprises a first portion opposing the second substrate and having a first thickness and a second portion not opposing the second substrate and having a second thickness which is less than the first thickness, and
the light source is disposed on the second portion. [2]
The display device as described in item [1] above, wherein
the light source comprises a first surface opposing the second portion and a second surface opposing the first surface, and the second portion is formed so that, when the light source obtains power from a wiring substrate disposed on the second surface, the wiring substrate does not protrude with respect to the second substrate in the thickness direction.

[3]
The display device as described in the item [1] above, wherein
the second portion is formed so that, when the light source obtains power from the wiring line disposed on the first substrate, the light source does not protrude with respect to the second substrate in the thickness direction.

[4]
The display device as described in the item [2] above, wherein
the first substrate comprises a signal line, and
the signal line at least partially overlaps the light source.

[5]
The display device as described in the item [3] above, wherein
the first substrate comprises a signal line, and
the signal line does not overlap the light source.

[6]
The display device as described in any one of items [1] to [5] above, wherein
the second portion comprises a concave portion with a depth corresponding to a difference between the first thickness and the second thickness.

[7]
The display device according to any one of items [1] to [6] above, wherein
the second thickness is less than half of the first thickness.

[8]
The display device as described in any one of items [1] to [7] above, wherein
the light source emits light to a side surface of the second substrate.

[9]
The display device as described in item [8] above, wherein
an air layer is provided between the light source and the side surface of the second substrate.

[10]
The display device as described in any one of items [1] to [9] above, wherein
the liquid crystal layer contains polymer-dispersed liquid crystal.

What is claimed is:
1. A display device comprising:
a first substrate;
a second substrate opposing the first substrate;
a liquid crystal layer disposed between the first substrate and the second substrate;
a light source that emits light to the liquid crystal layer, and
an IC chip, wherein
the first substrate comprises a first portion opposing the second substrate and having a first thickness and a second portion not opposing the second substrate and having a second thickness which is less than the first thickness,
the light source is disposed on the second portion,
the IC chip is disposed on the second portion,
the light source comprises a first surface opposing the second portion and a second surface opposing the first surface,
a wiring substrate is disposed on the second surface, and the wiring substrate and the IC chip overlap in a plan view.

2. The display device of claim 1, wherein the wiring substrate does not protrude with respect to the second substrate in a thickness direction.

3. The display device of claim 1, wherein the second portion comprises a concave portion with a depth corresponding to a difference between the first thickness and the second thickness.

4. The display device of claim 1, wherein the second thickness is less than half of the first thickness.

5. The display device of claim 1, wherein the light source emits light to a side surface of the second substrate.

6. The display device of claim 5, further comprising: an air layer provided between the light source and the side surface of the second substrate.

7. The display device of claim 1, wherein the liquid crystal layer comprises a polymer-dispersed liquid crystal.

8. A display device comprising:
a first substrate;
a second substrate opposing the first substrate;
a liquid crystal layer disposed between the first substrate and the second substrate; and
a light source that emits light to the liquid crystal layer, wherein
the first substrate comprises a first portion opposing the second substrate and having a first thickness, a second portion not opposing the second substrate and having a second thickness which is less than the first thickness, and a first side surface between the first portion and the second portion,
the light source is disposed on the second portion, and
the light source emits light to the first side surface.

9. The display device of claim 8, further comprising: an air layer provided between the light source and the first side surface.

10. The display device of claim 8, wherein the light source emits light to a side surface of the second substrate.

11. The display device of claim 10, further comprising: an air layer provided between the light source and the side surface of the second substrate.

12. The display device of claim 8, wherein the liquid crystal layer comprises a polymer-dispersed liquid crystal.

* * * * *